United States Patent
Reinhardt et al.

(10) Patent No.: US 7,044,745 B2
(45) Date of Patent: May 16, 2006

(54) ELECTRONIC DEVICE

(75) Inventors: Jörg Reinhardt, Lahnau (DE); Joachim Spratte, Osnabrück (DE)

(73) Assignee: Siemens Aktiengellschaft, Munich (DE)

( * ) Notice: Subject to any disclaimer, the term of this patent is extended or adjusted under 35 U.S.C. 154(b) by 0 days.

(21) Appl. No.: 10/415,815

(22) PCT Filed: Nov. 1, 2001

(86) PCT No.: PCT/DE01/04094

§ 371 (c)(1), (2), (4) Date: Oct. 14, 2003

(87) PCT Pub. No.: WO02/37702

PCT Pub. Date: May 10, 2002

(65) Prior Publication Data
US 2004/0053520 A1    Mar. 18, 2004

(30) Foreign Application Priority Data
Nov. 3, 2000    (DE) ................... 100 54 589

(51) Int. Cl.
*H01R 12/00*    (2006.01)
(52) U.S. Cl. .............. 439/61; 439/65; 439/631; 174/52.1; 361/788; 361/686; 361/803; 361/785; 361/784
(58) Field of Classification Search .......... 439/61, 439/631, 65; 174/52.1; 361/788, 686, 803, 361/785, 784
See application file for complete search history.

(56) References Cited

U.S. PATENT DOCUMENTS

| 5,055,055 | A | 10/1991 | Bakker |
| 5,173,845 | A | 12/1992 | Shaw |
| 6,335,867 | B1 * | 1/2002 | Ishibashi et al. ............ 361/788 |
| 6,392,142 | B1 * | 5/2002 | Uzuka et al. ............... 174/52.1 |

FOREIGN PATENT DOCUMENTS

| DE | 8520797.7 | 10/1985 |
| DE | 3809605 C2 | 10/1989 |
| DE | 4332716 A1 | 3/1995 |
| DE | 19717909 A1 | 10/1998 |
| DE | 19901483 A1 | 7/2002 |
| EP | 0194962 A1 | 9/1986 |
| EP | 0501192 A1 | 9/1991 |
| GB | 2004419 | 3/1979 |
| JP | 04043724 | 2/1990 |

* cited by examiner

*Primary Examiner*—Gary F. Paumen
(74) *Attorney, Agent, or Firm*—Morrison & Foerster LLP

(57) ABSTRACT

An electronic device has several superposed main printed circuit boards (2, 3, 4), of which one has e.g. the electronic components of a radio, another has the electronic components of a multimedia device and a third has the electronic components of a vehicle navigation device. On the front side of the electronic device, a connection printed circuit board (9) which is oriented crosswise to the main printed circuit boards (2, 3, 4) is provided with plug-in connecting parts (11, 13, 15) which engage on the front side of the main circuit boards (2, 3, 4).

6 Claims, 1 Drawing Sheet

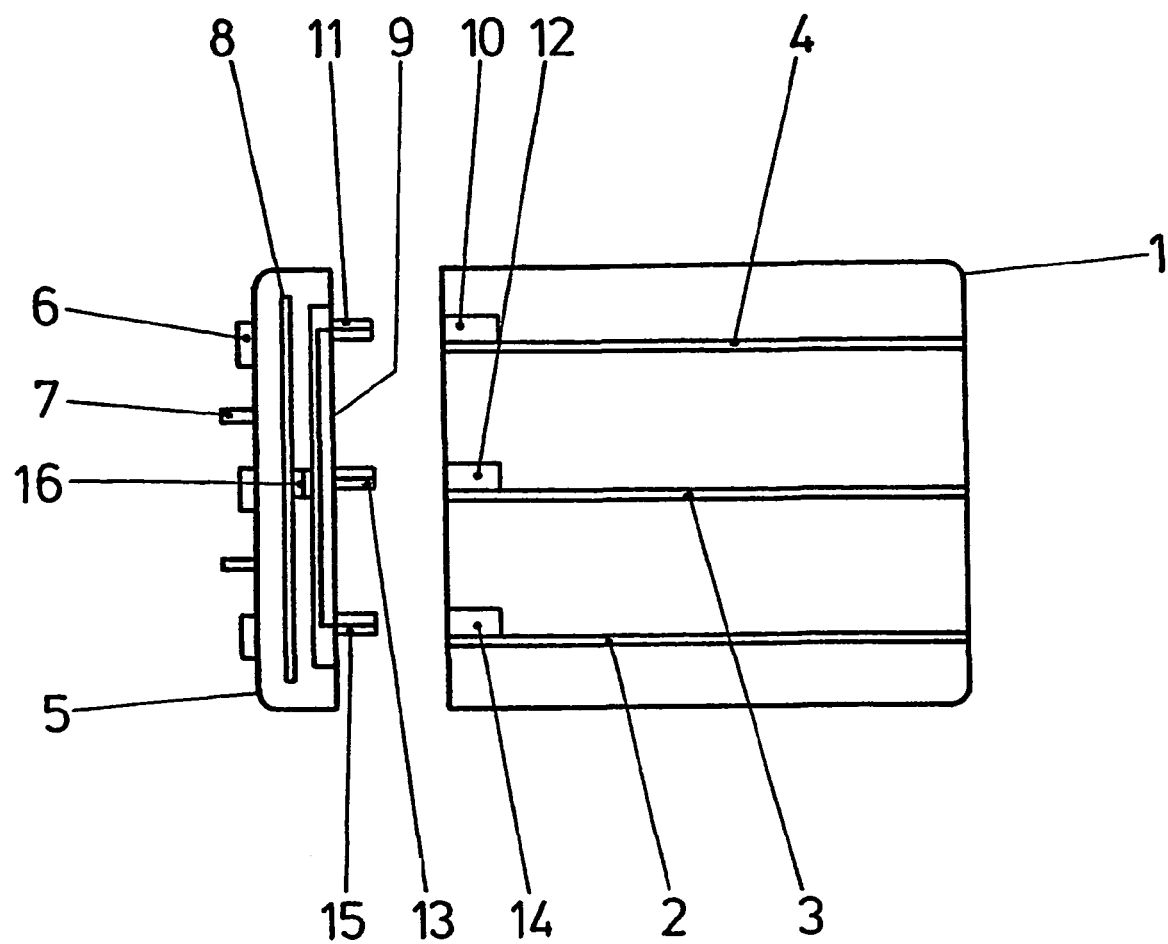

ELECTRONIC DEVICE

CLAIM FOR PRIORITY

This application claims the benefit of priority to PCT/DE01/04094, filed Nov. 1, 2001, and published in the German language, which claims priority to German Application No. 10054589.0, filed Nov. 3, 2000.

TECHNICAL FIELD OF THE INVENTION

The invention relates to an electronic device having several main boards arranged on top of or adjacent to one another.

BACKGROUND OF THE INVENTION

Electronic devices of the aforementioned type are, for example, provided in today's motor vehicles and are therefore known in the art. As a signal exchange normally takes place between the individual main boards, it is necessary to electrically connect the boards to one another. In the devices known in the art, this is accomplished by providing pin-and-socket connectors on the front sides, so that the necessary connections between the main boards can be established by means of electrical wiring. However, establishing these connections is highly labor-intensive and is associated with the risk of individual pin-and-socket connections being inadvertently omitted, thereby rendering the device inoperable.

SUMMARY OF THE INVENTION

According to one embodiment of the invention, this problem is solved in that a connecting board oriented at right angles to the main boards and having additional pin-and-socket connectors, which engage the respective pin-and-socket connector of the main boards, is provided on the front side of the electronic device.

As a result of this design of the electronic device, it is only necessary, following assembly of the main boards, to mount the connecting board and its pin-and-socket connectors onto the main boards from the front, so as to establish the necessary connections among the main boards. This eliminates the need to establish the necessary electrical connections individually and sequentially by closing pin-and-socket connections between the individual main boards, so that the electronic device of the invention can be assembled more quickly than the devices known in the art, thereby automatically ensuring that all electrical connections are closed.

The electrical connections can be closed concurrently with the assembly of the front plate if, according to a further development of the invention, the connecting board is provided on a front plate of the electronic device that features control elements.

Alternatively, however, it is also possible to provide the connecting board with at least one pin-and-socket connector, on its side facing the front board, for purposes of connecting it to a secondary board in the front plate.

In addition to its current distribution function, the connecting board can also provide the function of a printed circuit board, in that the connecting board constitutes a secondary board as a result of electronic components arranged on it.

Since, due to production tolerances, the pin-and-socket connectors of the main board will not always be aligned with the pin-and-socket connectors of the connecting board, it is advantageous to provide for the possibility of tolerance adjustment. This can be accomplished very easily in that the pin-and-socket connectors of the connecting board and/or the main boards are arranged to be displaceable, to a limited extent, at right angles to the direction of insertion. Such pin-and-socket connectors are commercially available under the name board-to-board connectors.

BRIEF DESCRIPTION OF THE DRAWINGS

The invention allows for various embodiments. To further illustrate its basic principle, one of these embodiments is depicted in the drawing, and is described in the following.

FIG. 1 illustrates a housing of an electronic device with three main boards arranged on top of one another.

DETAILED DESCRIPTION OF THE INVENTION

FIG. 1 illustrates a housing 1 of an electronic device, with three main boards 2, 3, 4 being arranged on top of one another within said housing. The lowermost main board 2 can, for example, carry the electronic components of a radio, the center main board 3, the electronic components of a multimedia device, and the upper main board 4, the electronic components of a vehicle navigation system.

The housing 1 can be closed with a front plate 5 depicted in front of its front face. The front plate features control elements 6, 7 for the individual features of the device, and has in its interior a secondary board 8. On the side facing the front side of the housing 1, the front plate features a connecting board 9.

In the invention, the individual main boards 2, 3, 4, on their front side, and the connecting board 9, on its side facing the housing 1, have pin-and-socket connectors 10 to 15, wherein, during mounting of the front plate 5, the pin-and-socket connectors 11, 13, 15 of the front plate 5 enter the pin-and-socket connectors 10, 12, 14 of the main boards 2, 3, 4, thereby establishing electrical connections among the main boards 2, 3, 4 via the connecting board 9.

In the exemplary embodiment depicted, the connecting board 9 is connected to the secondary board 8 via a pin-and-socket connection 16. However, it is also possible to dispense with the secondary board 8 and to dispose the electronic components to be arranged thereon on the connecting board 9.

What is claimed is:

1. An electronic device, comprising:
    main boards arranged on top of one another or adjacent to one another, each of which includes a pin-and-socket connector arranged on a front side for electrically connecting the boards; and
    a front plate comprising a connecting board oriented at right angles to the main boards and having additional pin-and-socket connectors which engage the respective pin-and-socket connector of the main boards and is provided on the front side of the electronic device, and control elements facing outside the electronic device.

2. The electronic device according to claim 1, wherein the connecting board is provided on the front plate of the electronic device that features control elements.

3. The electronic device according to claim 1, wherein the connecting board is provided with at least one pin-and-socket connector, on a side facing the front board to connect to a secondary board in the front plate.

4. The electronic device according to claim 1, wherein the connecting board constitutes a secondary board as a result of electronic components arranged thereon.

5. The electronic device according to claim 1, wherein the pin-and-socket connectors of the connecting board and/or of the main boards are arranged to be displaceable at right angles to the direction of insertion.

6. The electronic device according to claim 1, wherein a first of the main boards has electronic components of a radio, a second of the main boards has electronic components of a multimedia device, and a third of the main boards has electronic components of a vehicle navigation system.

* * * * *